US010629353B2

(12) United States Patent
Delette et al.

(10) Patent No.: US 10,629,353 B2
(45) Date of Patent: Apr. 21, 2020

(54) ELECTRONIC DEVICE INCLUDING AT LEAST ONE INDUCTOR COMPRISING PASSIVE HEAT MANAGEMENT MEANS

(71) Applicant: COMMISSARIAT A L'ENERGIE ATOMIQUE ET AUX ENERGIES ALTERNATIVES, Paris (FR)

(72) Inventors: Gerard Delette, Grenoble (FR); Pierre Perichon, Voiron (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 131 days.

(21) Appl. No.: 16/063,068

(22) PCT Filed: Dec. 16, 2016

(86) PCT No.: PCT/EP2016/081391
§ 371 (c)(1),
(2) Date: Jun. 15, 2018

(87) PCT Pub. No.: WO2017/103078
PCT Pub. Date: Jun. 22, 2017

(65) Prior Publication Data
US 2019/0392975 A1 Dec. 26, 2019

(30) Foreign Application Priority Data
Dec. 17, 2015 (FR) .................... 15 62600

(51) Int. Cl.
*H01F 27/24* (2006.01)
*H01F 27/08* (2006.01)
(Continued)

(52) U.S. Cl.
CPC ............. *H01F 27/08* (2013.01); *H01F 27/24* (2013.01); *H01F 27/2804* (2013.01);
(Continued)

(58) Field of Classification Search
CPC .................................................. H01F 27/00–36
(Continued)

(56) References Cited

U.S. PATENT DOCUMENTS

| 4,603,314 A | 7/1986 | Fukunaga et al. |
| 6,222,733 B1 | 4/2001 | Gammenthaler |

(Continued)

FOREIGN PATENT DOCUMENTS

| DE | 20 2014 105 157 U1 | 12/2014 |
| EP | 1 530 223 A1 | 5/2005 |

(Continued)

OTHER PUBLICATIONS

International Search Report dated Mar. 23, 2017, in PCT/EP2016/081391 filed Dec. 16, 2016.

(Continued)

*Primary Examiner* — Tuyen T Nguyen
(74) *Attorney, Agent, or Firm* — Oblon, McClelland, Maier & Neustadt, L.L.P.

(57) ABSTRACT

An electronic device including a carrier, at least one active component, and at least one inductor, the inductor including a core and a winding surrounding at least part of the core, the core delimiting at least part of a magnetic field along which magnetic flux lines are intended to run. The core includes a body including at least two portions defining two successive zones of the magnetic path, the thickness of each portion being lower with respect to the length and to the width thereof, each portion including a surface that is lateral with respect to a direction of the magnetic path, a first of the portions being in direct contact with the carrier via part of its lateral surface and a second portion being positioned with respect to the carrier such that its lateral surface is free of contact with the carrier.

17 Claims, 1 Drawing Sheet

(51) Int. Cl.
    *H01F 27/28* (2006.01)
    *H01F 27/29* (2006.01)
    *H01F 41/06* (2016.01)
    *H01L 23/31* (2006.01)

(52) U.S. Cl.
    CPC ............ *H01F 27/29* (2013.01); *H01F 41/06* (2013.01); *H01L 23/3114* (2013.01)

(58) Field of Classification Search
    USPC ....... 336/65, 83, 90, 92, 192, 200, 210–215, 336/232–234
    See application file for complete search history.

(56) References Cited

U.S. PATENT DOCUMENTS

| | | |
|---|---|---|
| 6,392,519 B1 | 5/2002 | Ronning |
| 9,001,524 B1 | 4/2015 | Akre |
| 2006/0097831 A1 | 5/2006 | Lotfi et al. |
| 2007/0139151 A1 | 6/2007 | Nussbaum |
| 2009/0160595 A1 | 6/2009 | Feng et al. |
| 2010/0148910 A1 | 6/2010 | Takada |
| 2012/0161911 A1 | 6/2012 | Moiseev et al. |
| 2012/0293290 A1 | 11/2012 | Kido et al. |
| 2012/0306605 A1 | 12/2012 | Moiseev |

FOREIGN PATENT DOCUMENTS

| | | | |
|---|---|---|---|
| EP | 1530223 A1 | * | 11/2005 |
| EP | 1 971 193 A1 | | 9/2008 |
| EP | 2 469 545 A2 | | 6/2012 |
| EP | 2 506 273 A1 | | 10/2012 |
| WO | WO 03/088285 A1 | | 10/2003 |
| WO | WO 2014/141670 A1 | | 9/2014 |

OTHER PUBLICATIONS

French Search Report dated Aug. 29, 2016, in French Application 1562600 filed Dec. 17, 2015.

* cited by examiner

ELECTRONIC DEVICE INCLUDING AT LEAST ONE INDUCTOR COMPRISING PASSIVE HEAT MANAGEMENT MEANS

TECHNICAL DOMAIN AND STATE OF PRIOR ART

This invention relates to an electronic device including at least one magnetic inductor comprising passive heat management means, for example a power converter.

In the field of power electronics, inductors comprising a ferromagnetic core at least partly surrounded by an electrical conducting winding are used as passive components, principally in power converters. Power converters can operate at frequencies between 100 kHz and 10 MHz and transmit powers of 0.1 kW to 100 kW. These converters are used particularly in the field of energy production, to supply power to electrical motors and electronic systems (electronic devices, portable computers). In these application fields, the inductance values of converters are between 1 µH and 10 mH.

Inductors comprise a core and an electrical conductor called a winding, arranged with N turns around part of the core. The core comprises a ferromagnetic material. During operation, an alternating electrical current passes through the winding, generating a magnetic induction with the same frequency in the core. Losses appear with generation of the magnetic induction, which results in temperature rises within the magnetic core. These losses increase with the operating frequency of the inductor, requirement heat management above about 1 MHz to cool the core and to prevent unacceptable temperature rises.

A power converter is an electronic device that has the function of adapting the voltage and the current output by an electrical power source to supply power to a distribution network or a given electrical system, depending on the specifications. The converter comprises electronic components called active components that operate like switches, switching at a given frequency. In the case for example of DC/DC converters, the active components are transistors that are used to "chop" the input voltage at regular cycles. In order to output a dc output voltage, inductors are also used to store and to restore electrical energy in each cycle and to smooth the output voltage to its average value. These so-called "passive" components are used for operation of converters, but they may account for up to 40% of the volume and cost of the converter.

Converter operating frequencies typically lie within the 10 kHz-500 kHz range. Due to the GaN technology, transistors capable of switching at very high frequency (for example at a frequency of more than 1 MHz) can be made, so that converters operating at higher frequency can be fabricated.

Firstly, the increase in the operating frequency should be particularly interesting because it would make it possible to reduce the volume of passive components of converters and therefore the dimensions, mass and cost of these devices. By increasing the switching frequency, the number of electrical cycles increases and thus the energy transferred by the magnetic core within a given time increases in the same proportion. Since the power of the converter remains constant, it should be possible to reduce the volume of the magnetic inductors inversely proportional to the frequency.

This reduction in the volume of magnetic cores is particularly useful for making smaller, lighter weight and less expensive converters. Such converters are desirable in the aeronautical sector and in the automobile sector.

Secondly inductors compatible with power converters operating at frequencies of between 100 kHz and 10 MHz and powers of 0.1 kW to 100 kW are characterised by values of the inductance L between 1 µH and 10 mH and volumes of more than 1 $cm^3$. In this range of converters, the best adapted inductors are of the monolithic type, unlike technologies based on thin films or multilayer LTCC structures limited to powers of less than 10 W.

Monolithic inductors are composed of a single-piece of ferromagnetic material forming their core. This material is characterised by high values of the relative magnetic permeability µr, for example more than 50 and magnetic induction at saturation Bs, for example more than 100 mT.

Ferrite type oxide materials with a spinel crystallographic structure have permeability values that are stable at high frequency. This is why they are very widely used as inductor cores, particularly for operation at high frequency (100 kHz<f<10 MHz). The most frequently used formulations are (Mn1-xZnxFe2O4) and (Ni1-xZnxFe2O4). These materials are also characterised by high values of electrical resistivity limiting losses by induced currents.

Despite their optimisation, these ferromagnetic materials are the source of energy dissipation processes also called magnetic losses. These magnetic losses are dissipated in the form of heat at all points in the volume of the core. Thus, despite the reduction in the volume of the core made possible by the increase in frequency and making it possible to achieve specific powers of 100 W/$cm^3$, it becomes necessary to limit heat dissipation within the core to prevent an excessive temperature rise in the core.

This is particularly the case because magnetic losses increase with the frequency and with the peak value of the magnetic induction.

Moreover, it has been shown that a small inductor volume tends to cause more heating in the core. For example, a 1 kW converter (200 V/400V) functioning at 5 MHz requires an inductance of 10 µH. A compact 4F1 ferrite core (type E-E) can be designed to make the inductor. With a volume of 10 $cm^3$, corresponding to a specific power of 100 W/$cm^3$, the calculated core internal temperature reaches 210° C., considering a natural convection method of evacuating heat. The volume of the inductor has to be increased to 50 $cm^3$ to reduce the temperature to a value of 70° C. acceptable for the material.

It has been proposed that heating can be reduced by improving heat exchange at the surface of the core. For example, temperature regulation systems that include a heat exchanger can be used but they make the converter less compact and increase its cost.

It is also known that reducing the effective permeability by the creation of air gaps in the core is a good way of reducing the induction effect and reducing heating. But the addition of an air gap increases the size of the core and can degrade electromagnetic compatibility of the inductor due to radiation of the magnetic field in the air gaps.

It has also been proposed that plane inductors can be made in which the thickness of the core is small relative to its length and its width.

Document U.S. Pat. No. 9,001,524 describes an integrated circuit comprising an inductor forming a frame, the core is flat and is in the form a frame surrounding the carrier. This inductor also occupies a large space on the carrier and heat exchanges are not optimised.

PRESENTATION OF THE INVENTION

Consequently, one purpose of this invention is to provide a very compact electronic device comprising at least one active component and at least one inductor, with good heat management.

The purpose stated above is achieved using a device comprising a carrier, at least one active component fixed on the carrier and at least one inductor, the inductor comprising a magnetic core and a conductor partly surrounding the core, the core comprising a body with a very low thickness to length ratio. The body at least partly defines a magnetic path, and the body comprises at least one first portion and one second portion defining two successive zones of the magnetic path, the first portion being in contact with the carrier and the second portion in a position relative to the carrier so as to have small contact with it.

For the purposes of this application, the term "magnetic path" means the path followed by magnetic flux lines generated in the core by the current circulating in the electrical conductor surrounding a part of the core. The magnetic path follows a closed magnetic circuit. The magnetic circuit may comprise parts composed of different materials, these parts are for example the core and the air gaps; each with its own section and length.

Thus the surfaces of the second portion, for which the contact with the carrier is reduced, can exchange heat more efficiently and cool the core. Therefore heat management of the core is facilitated. Furthermore, the layout of this second portion makes it possible to release space for other components to be fixed on the carrier and/or reduce the area of the carrier. Part of the core occupies a zone above the carrier usually delimited by a package and generally unoccupied. Therefore the device can be made more compact while limiting the temperature rise of the core.

Very advantageously, the second portion of the core is in thermal contact with an element, for example a plate, with a large area that is even more efficient in exchanging heat by convection. Heat management of the inductor is further improved. The package itself can help to evacuate heat from the core.

In other words, a device is made in which the inductor comprises a magnetic core in the form of strip(s) shaped and/or arranged so as to form a three-dimensional structure, part of which is not in contact with the carrier to increase the heat exchange area, which makes it possible to occupy unoccupied zones of the device and to make it more compact and limit heating of the core.

In one example embodiment, the ferromagnetic core comprises thin flat parts so as to reduce the volume of the core, to improve heat exchanges and reduce the volume occupied by the inductor in the converter. The flat parts forming the core are assembled or connected together so as to form a long three-dimensional structure with a small cross-section forming a magnetic circuit. The three-dimensional structure is designed such that it occupies the smallest possible volume in the converter, particularly making use of available volumes.

One subject-matter of this invention is then an electronic device comprising a carrier, at least one active component and at least one inductor, said inductor comprising a core and an electrical conductor surrounding at least part of the core, the core delimiting at least a part of a magnetic path along which magnetic flux lines will flow, the core comprising a body with at least two portions defining two successive zones of the magnetic path, each portion remaining thin relative to its length and its width, each portion comprising a lateral surface relative to a direction of the magnetic path, one of the portions being in direct contact with the carrier through part of its lateral surface and the other portion being located relative to the carrier such that its lateral surface does not come into contact with the carrier.

Advantageously, the thickness to length ratio is between 1/200 and 1/10 and the thickness to width ratio is between 1/20 and 1.

In one example embodiment, the core may comprise an air gap between the first portion and the second portion.

The electronic device may comprise a package mounted on the carrier, said package and the carrier defining a volume in which the at least one active component and the inductor are housed.

Preferably, at least the second portion of the inductor is shaped to adapt to said volume.

In one example embodiment, the second portion is integrated into a wall of the package.

In one very advantageous example, the device may comprise at least one heat exchange plate thermally connected to the core. For example, the device comprises at least one heat conducting and electrically insulating element in contact with the core and with the heat exchange plate. The heat exchange plate can form at least a part of a wall of the package.

In one example embodiment, the electrical conductor forms a winding containing a part integrated into the carrier.

Preferably, the carrier is an integrated circuit.

Another subject-matter of this invention is a converter comprising at least one electronic device according to the invention, the active component being a transistor.

Another subject-matter of this invention is a method of manufacturing an electronic device according to the invention, including the following steps:
 a) supply a carrier,
 b) supply an active component and assemble it on the carrier,
 c) fabricate the inductor core,
 d) assemble the core on the carrier,
 e) supply and assemble the winding.

During step c), strips intended to form the first and second portions can be fabricated, for example by pouring a strip of a slurry containing ferromagnetic material powder or by injection moulding of powder from a feedstock comprising a strip of ferromagnetic material.

The strips can be made in a desired shape during step c).

During step c), for example at least part of the strips are fixed to each other to make a part of the core.

During step d), the strips can be assembled so as to form the core.

In one advantageous embodiment, part of the winding is made before the core is assembled and the other part is made after the core has been assembled.

BRIEF DESCRIPTION OF THE DRAWINGS

This invention will be better understood after reading the following description and the appended drawings on which.

DETAILED PRESENTATION OF PARTICULAR EMBODIMENTS

Figure 1:
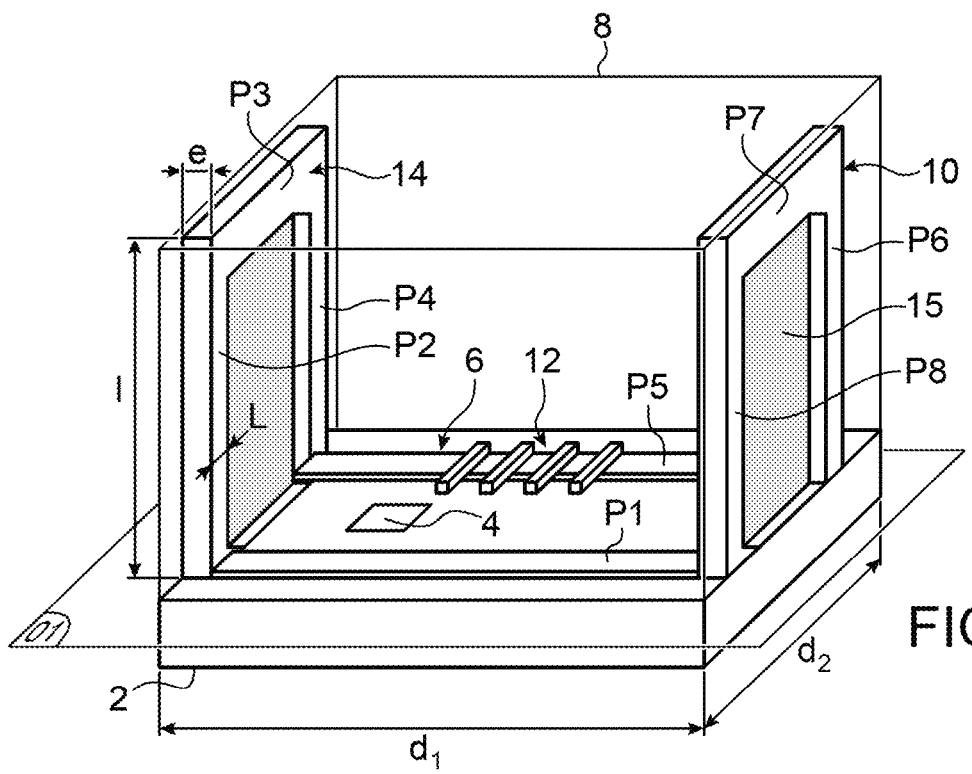
FIG. 1 is a perspective view of an example embodiment of an electronic device according to the invention.

FIG. 1 shows an example of an electronic inductor device according to the invention, for example a power converter.

The device in FIG. 1 comprises a carrier 2 composed of a thin rectangular plate, at least one active component 4, for example a transistor, fixed to the carrier 2, at least one inductor 6 and a package 8. The carrier 2 extends in a plane O1. The dimensions of the carrier in the plane O1 are denoted d1 and d2. The carrier may for example be an integrated circuit and the at least one active component 4 may be made integrated into the circuit.

The inductor 6 comprises a magnetic core 10 and an electrical conductor 12 or winding surrounding at least part of the core 10.

When a current circulates in the winding 12, magnetic flux lines circulate in the core along a magnetic path. In the case of a core in the form of a rectangular frame, the magnetic flux lines form closed loops. The magnetic flux lines flow along the magnetic path that extends along the entire length of the core.

The magnetic core 10 comprises a body 14 formed from a continuous strip or a succession of strips. The body of the core may for example be made of spinel ferrite, such as NiZn and MnZn, for example NiZ n4F1.

Each strip has a thickness e, a width L and a length l. The product e×L corresponds to the section of the core that is also equal to the magnetic section A of the core.

The thickness e is very much less than the width L and the length l, preferably by a factor of at least 10.

These proportions in the dimensions of the strips facilitate integration of the core because the strips thus formed can be shaped, for example bent or embossed, so as to match non-plane surfaces, which is not possible with thicker bars.

For example, e is between 1 mm and 5 mm, L is between 5 mm and 20 mm and l is between 50 mm and 200 mm, and e/L=1/10 and e/l=1/100.

It could be envisaged that the dimensions of the core (i.e. the thickness and/or the width) vary along the length of the magnetic path.

The strip(s) comprise(s) a lateral surface that in the case of a strip with a rectangular parallelepiped shape comprises two rectangular surfaces with a large area equal to L×l and two smaller rectangular surfaces with a smaller area equal to e×l.

In the example shown in FIG. 1, the body 14 of the core comprises eight straight sections denoted P1, P2, P3, P4, P5, P6, P7, P8. The eight portions delimit a loop inside which the magnetic flux lines circulate. The eight portions are straight in the example shown and extend along a longitudinal axis and each comprises two longitudinal ends.

In the example shown, the portions P1 and P5 are in contact with the carrier 2 through part of their lateral surface. In the example shown, the portions P1 and P5 are in contact with the carrier through one of their larger area surfaces.

As variants, the portions P1 and P5 of the core in contact with the carrier could rest on the carrier through one of the smaller area surfaces.

The portions P1 and P2 firstly fix the inductor on the carrier and secondly make the electrical connection with other components of the device. In the example shown, the arrangement of portion P5 also makes it possible to make the winding integrated into the carrier. The winding 12 is arranged around part of the portion P5, and its fabrication will be described below. This integrated embodiment even further reduces the dimensions of the inductor. But it will be understood that an inductor in which the winding is composed of a continuous conducting wire particularly surrounding at least one of the portions P2 to P4 and P6 to P8 is not outside the scope of this invention.

The portions P1 and P5 are arranged parallel to each other and extend over the entire dimension d1 of the carrier.

The portions P2, P3, P4 are located relative to each other so as to form an inverted U, with P3 forming the bottom of the U and portions P2 and P4 forming the legs of the U. The U thus formed is located in a plane orthogonal to plane O1. The U is arranged relative to portions P1 and P5 such that the legs of the U are connected to portions P1 and P5. The configuration of portions P6, P7 and P8 is similar to the configuration of portions P2, P3 and P4 and they are arranged in a plane orthogonal to plane O1 and parallel to the plane containing the portions P2, P3 and P4.

Preferably, an air gap is provided between two successive core portions. Fabrication of the inductor is simplified because the core can be made from plane portions. As a variant, it would be possible for some of the portions to be in contact with each other, or even that all portions are in contact forming a closed core. Also as a variant, the air gap or the air gaps could be provided in portion P1 and/or portion P5.

The lateral surfaces of portions P2, P3, P4 and P6, P7, P8 are not in contact with the carrier and can exchange heat by convection with the external environment. The core then has a very large heat exchange area, because it comprises the entire lateral surfaces of portions P2, P3, P4 and P6, P7, P8 and a large part of the lateral surfaces of portions P1 and P5. It should be noted that the part of the lateral surfaces of portions P1 and P5 in contact with the carrier exchanges heat with the carrier by conduction and participates in cooling the core.

Furthermore, the core occupies part of the volume located above the carrier, which can release space on the carrier or reduce the surface area of the carrier. Advantageously, the core is shaped to adapt to the internal volume of the package, thus occupying volumes that are generally unused.

In one very advantageous embodiment, it could be arranged for the walls of the package to be shaped to house part of the core. For example, the portions P2, P3, P4 and P6, P7, P8 can be integrated into the thickness of the walls of the package, further reducing the spatial footprint of the core and being conducive to heat exchanges with the exterior.

The winding may for example be made by forming a first half-winding in a substrate, a portion of the core on the first half-winding and a second half-winding on the portion of the core so as to form a complete winding, for example using microelectronics techniques. One example of such a method is described for example in document US2009/0160595. Such an inductor occupies an even smaller volume.

It will be understood that the number and the shape of portions can vary. The number of portions for which part of the lateral wall is in contact with the carrier can also vary. For example, all or some of the portions could be curved. It would be possible to envisage make a core body in a single piece directly with a three-dimensional shape.

Further, the relative arrangement of the portions with respect to each other can also vary. For example, the portions for which the side wall is not in contact with the carrier can be inclined relative to the plane of the carrier.

Preferably, the shape of the body is such that its projection onto the plane O1 is contained within the projection of the carrier such the entire device can be integrated into a package covering the carrier.

In the example shown, the core is symmetric about a plane orthogonal to plane O1, but this is not a limitative case and any other shape could be used capable of providing a long magnetic path optimally occupying the space above the carrier.

In one advantageous example, it would be possible to couple portions of the core with heat exchange means to improve evacuation of heat generated in the core.

Figure 2:
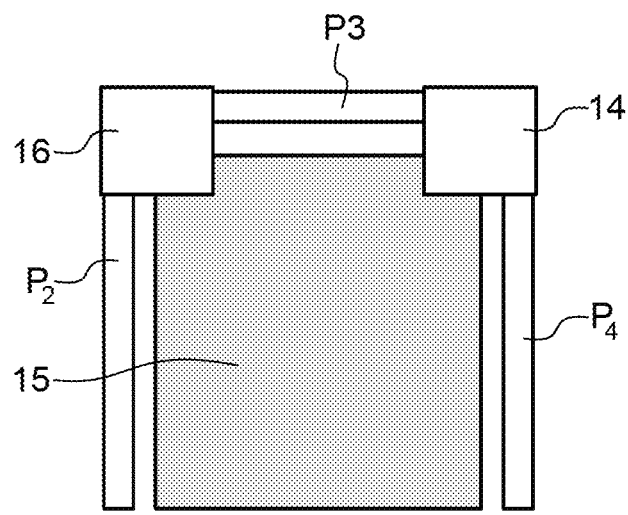
FIG. 2 is a top view of a detail of the fabrication of an electronic device according to another example embodiment.
Figure 3:
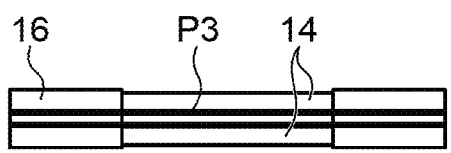
FIG. 3 is a side view of FIG. 2.

FIGS. 2 and 3 show an example embodiment of a detail of a core making use of such means.

This example includes part of the core in the form of a U composed of portions P2, P3, P4. Plates 15 are placed on each side of the U inside the space delimited by the U. The plates 15 are made from a material with very good thermal conductivity, such as AlN that has low electrical conductivity properties, or copper.

In the example shown, the external dimensions of the plates and the internal dimensions of the U are such that there is no contact between the plates and the portions P1, P2, P3. Thermal conducting and electrically insulating elements 16, for example made of AlN, are provided to form a thermal connection between the portions and the plates. The clearance between the plates 15 and the portions can for example be used to make a winding around one of the legs.

The thermal conducting and electrically insulating elements can prevent flux leaks close to the core that could create induced currents.

Thus, heat generated in the core is transmitted to the heat exchange plates by conduction through the elements 16 and heat is then evacuated by convection.

In the case in which the heat exchange plates are made of an electrically insulating material, a direct contact between the core and the heat exchange plates can be made as shown on FIG. 1, heat is evacuated directly from the core to the heat exchange plates.

In the example shown, the heat exchange plates are located inside the space delimited by the portions of the core such that the edges of the plate are facing the lateral face of the segments, but it could be arranged such that one of the faces of the plate is facing or is even in direct contact with portions of the core. As a variant, a single plate 15 could be used.

As shown on FIG. 1, the heat exchange plate could for example be integrated into the package, for example it could form part of a wall of the package. Thus, heat exchange by convection is improved.

According to one advantageous example, it would also be possible for one or more heat exchange plates to be in thermal contact with portions P1 and P5 that bear on the carrier so as to increase the exchange area with the exterior, while improving drainage of heat from the core because contact between the plates and the core is larger. For example, one plate can be in contact with the lateral face of portions opposite the face in contact with the carrier. It would be possible to make windows in the plate(s) so that other components can pass through. These plates can be profiled to increase heat exchange. As a variant, a plate could be placed on each side of the portions P1 and P5.

Very advantageously, it would be possible to provide fins on the lateral surface of portions and/or on the package to further increase heat exchanges. Preferably, the fins are oriented such that they are approximately parallel to the magnetic flux lines.

For comparison, a 1 kW DC/DC voltage step up converter (200/400 V) requires a storage inductance of 10 µH for operation at 5 MHz. This inductance can be obtained with an assembly of two standard E type ferromagnetic components known in the state of the art occupying a total volume of 50 cm$^3$ and having an exchange area of 200 cm$^2$. There are other core shapes with smaller volumes but they also have smaller heat exchange areas, and their use would increase the operating temperature of the inductor.

Due to the invention, the same converter can be made with a core having a volume of 10 cm$^3$ while keeping a heat exchange area of 200 cm$^2$. For example, the core then comprises strips with thickness e equal to 4 mm and width L equal to 9 mm. The total required length l of the magnetic circuit is 300 mm. The core can be made by juxtaposition of ten strips with an identical length of 30 mm arranged so as to form the circuit in FIG. 1. The lateral and lower surfaces can develop the total exchange area of 200 cm$^2$.

We will now describe methods of fabrication of a device according to the invention.

The fabrication method includes the following steps
a) supply a carrier,
b) supply an active component and assemble it on the carrier,
c) fabricate the inductor core,
d) assemble the core on the carrier,
e) supply and assemble the winding.

Step a) can include the carrier fabrication step, for example the step to fabricate an integrated circuit.

Step b) can be coincident with step a), particularly when the carrier is an integrated circuit, the active component that is for example a transistor, can be made at the same time as the integrated circuit.

Step c) can include steps d) and e):

The core portions can advantageously be made by a strip moulding method that is particularly suitable for making thin parts, for example of the order of 1 mm.

It makes use of a preparation comprising ferromagnetic material powders dispersed in solvents and organic binders. This preparation is called a slurry. The slurry is spread on a plane carrier, for example using a pad fitted with a blade. Movement of the blade causes shear and levelling of the slurry deposited on it, providing a good plane and homogeneous deposit. The thickness of the strip thus formed can be controlled by adjusting the height of the blade. The strip thus formed is then subjected to different evaporation and drying treatments to eliminate some of the solvents. This strip moulding method is known to those skilled in the art. At this stage, the strip is flexible and easily manipulated. In particular it can easily be cut to a particular pattern using classical cutting tools.

It would also be possible to fold or curve the strip at this stage on a carrier that confers a profile on it.

In this invention, some portions of the core can be formed in this way. For example, a template with the required profile for example made of alumina can be used. For example, the template may be made by machining. The strip is deposited on the template and is then bent by applying a mechanical force to make it match the shape. The assembly is heat treated at high temperature to sinter the strip. Sintering is accompanied by shrinkage of the material in all directions of the order of 10%-15%, and cutting dimensions of the unbaked strip and the dimensions of the template allow for this shrinkage.

In one variant embodiment, the strip comprising the ferromagnetic material can be assembled and welded to other strips made of a different material, the properties of which are determined so as to make some of the heat conducting elements and the winding. The assembly is then cosintered to make all or some of the inductor.

According to another example embodiment, the portions of the inductor core are made by powder injection moulding (PIM).

The first step in a PIM process is to obtain a feedstock adapted to the target application. The feedstocks are composed of a mix of organic material (or polymer binder) and inorganic powders (metallic or ceramic) that will form the final part. The feedstock is then injected as a thermoplastic material in an injection press using a technology known to an expert in the subject. Moulding melts the polymers injected with the powder into a cavity and confers the required shape onto the mix. During cooling, the mix solidifies and keeps the shape conferred by the mould.

After removal from the mould, different heat or chemical treatments are applied to the part to remove organic phases. Elimination of the organic phase during this step, called debinding, leaves room for 30% to 50% porosity in the blank. U.S. Pat. No. 8,940,816 B2 describes a method for preparing a feedstock and for debinding in the case of fabrication by PIM.

After debinding, the porous blank only contains powders of the inorganic material. This blank is then densified to form the final dense part. The porous blanks are consolidated by high temperature sintering, for example at more than 1000° C., in furnaces operating under an atmosphere suitable for the type of material used. When the optimum density has been achieved, the part is cooled to ambient temperature.

During step c), it is possible to either make straight strips that will be assembled to each other afterwards and/or arranged relative to each other to form the three-dimensional core according to the invention, or to make a core in a single piece including at least one portion for assembly of the core on the carrier.

At this stage, the sintered strips form rigid components that can be manipulated. These components are particularly stable and can be exposed to mechanical stresses for example of several MPa, and temperature rises for example of the order of several hundred degrees. The strips can be assembled for example by gluing, for example using a heat conducting glue. For example, the strips can be assembled and inserted in housings with a corresponding shape in the carrier and/or the package.

For example these housings can be made by moulding when the package and/or the carrier are made of plastic. The strips can be held in position by mechanical means, for example by crimping, or by gluing for example using an epoxy resin.

Step e) can be done using the technique described in document US2009/0160595 described above. In this case, steps d) and e) take place simultaneously.

This invention is particularly suited to manufacturing of compact power converters operating at high frequencies, because the inductor can very efficiently limit heating of the core.

The invention claimed is:

1. An electronic device comprising:
   a carrier;
   at least one active component and at least one inductor;
   the at least one inductor comprising a magnetic core and an electrical conductor surrounding at least part of the magnetic core,
   the magnetic core delimiting at least a part of a magnetic path along which magnetic flux lines will flow, in which the magnetic core is located on one side of the carrier, and comprises at least one first portion and one second portion defining two successive zones of the magnetic path, each first portion and second portion having a shape of a strip with a thickness smaller relative to its length and its width,
   each first portion and second portion comprising a lateral surface relative to a direction of the magnetic path, the first portion being in direct contact with the carrier through part of its lateral surface and being surrounded by the electrical conductor,
   the second portion being located relative to the carrier such that its lateral surface does not come into contact with the carrier,
   wherein for each of the first and second portions, a thickness to length ratio is between 1/200 and 1/10 and a thickness to width ratio is between 1/20 and 1.

2. An electronic device according to claim 1, wherein for each portion, the ratio between the thickness and the length and the ratio between the thickness and the width are less than at least 1/10.

3. An electronic device according to claim 1, wherein the magnetic core comprises an air gap between the first portion and the second portion.

4. An electronic device according to claim 1, further comprising a package mounted on the carrier, the package and the carrier defining a volume in which the at least one active component and the inductor are housed.

5. An electronic device according to claim 4, wherein the second portion is integrated into a wall of the package.

6. An electronic device according to claim 1, further comprising at least one heat exchange plate thermally connected to the magnetic core.

7. An electronic device according to claim 6, further comprising at least one heat conducting and electrically insulating element in contact with the magnetic core and with the heat exchange plate.

8. An electronic device according to claim 6, further comprising a package mounted on the carrier, the package and the carrier defining a volume in which the at least one active component and the inductor are housed, and in which the heat exchange plate at least partly forms a wall of the package.

9. An electronic device according to claim 1, wherein the electrical conductor forms a winding containing a part integrated into the carrier.

10. An electronic device according to claim 1, wherein the carrier is an integrated circuit.

11. A converter comprising at least one electronic device according to claim 1, wherein the active component is a transistor.

12. A method of manufacturing an electronic device according to claim 1, comprising:
    a) supplying a carrier;
    b) supplying an active component and assembling the active component on the carrier;
    c) fabricating the magnetic core;
    d) assembling the magnetic core on the carrier;
    e) supplying and assembling the winding.

13. A manufacturing method according to claim 12, wherein during c), strips to form the first and second portions are fabricated, by pouring a strip of a slurry containing ferromagnetic material powder or by injection molding of powder from a feedstock comprising the strip of ferromagnetic material.

14. A manufacturing method according to claim 13, wherein during c), the strips are put into a required shape.

15. A manufacturing method according to claim 13, wherein during c), at least part of the strips are fixed to each other to make a part of the magnetic core.

16. A manufacturing method according to claim 13, wherein during d), the strips are assembled to form the magnetic core.

17. A manufacturing method according to claim 12, wherein a first part of the winding is made before the magnetic core is assembled and a second part of the winding is made after the magnetic core has been assembled.

\* \* \* \* \*